(12) United States Patent
Uchiyama

(10) Patent No.: US 6,448,663 B1
(45) Date of Patent: *Sep. 10, 2002

(54) SEMICONDUCTOR DEVICE, SEMICONDUCTOR DEVICE MOUNTING STRUCTURE, LIQUID CRYSTAL DEVICE, AND ELECTRONIC APPARATUS

(75) Inventor: Kenji Uchiyama, Hotaka-machi (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/519,436

(22) Filed: Mar. 3, 2000

(30) Foreign Application Priority Data

Mar. 8, 1999 (JP) .......................... 11-060459

(51) Int. Cl.⁷ .............................. H01L 23/48
(52) U.S. Cl. ..................... 257/778; 257/780; 257/773; 257/776; 257/789
(58) Field of Search ................. 257/773, 776, 257/778, 780, 779, 789

(56) References Cited

U.S. PATENT DOCUMENTS

| 5,226,232 A | * 7/1993 | Boyd ..................... 29/846 |
| 5,473,197 A | * 12/1995 | Idaka et al. ............. 257/786 |
| 5,844,314 A | * 12/1998 | Kim ...................... 257/737 |
| 5,903,056 A | * 5/1999 | Canning et al. .......... 257/773 |

FOREIGN PATENT DOCUMENTS

JP  409051018 A  * 2/1997

* cited by examiner

Primary Examiner—David L. Talbott
Assistant Examiner—Luan Thai
(74) Attorney, Agent, or Firm—Mark P. Watson; Michael T. Gabrik

(57) ABSTRACT

A semiconductor device, a mounting structure thereof, a liquid crystal device, and an electronic apparatus having an improved bump electrode structure, such that the bump electrodes and corresponding electrode terminals can be electrically connected through an anisotropic conductive film without compromising, or causing deterioration of, the electrical characteristics or reliability of the device, even when the bump electrodes are formed with a narrow pitch. Since the bump electrodes of the semiconductor device are tapered inward from top to bottom, the base portions of adjacent bump electrodes are spaced apart from each other by wider gaps than the corresponding upper portions. Thus, a large number of conductive particles in the conductive film do not gather between adjacent bump electrodes to cause short-circuiting therebetween. Further, since the upper portions of the bump electrodes are wider and the opposing surface areas of both the bump electrodes and the electrode terminals are relatively large, a large number of conductive particles are distributed between the bump electrodes and the electrode terminals. This ensures that the bump electrodes and the electrode terminals are electrically connected in a satisfactory manner. Therefore, with this arrangement, a high level of reliability can be achieved, even when the bump electrodes are formed in high density.

13 Claims, 7 Drawing Sheets

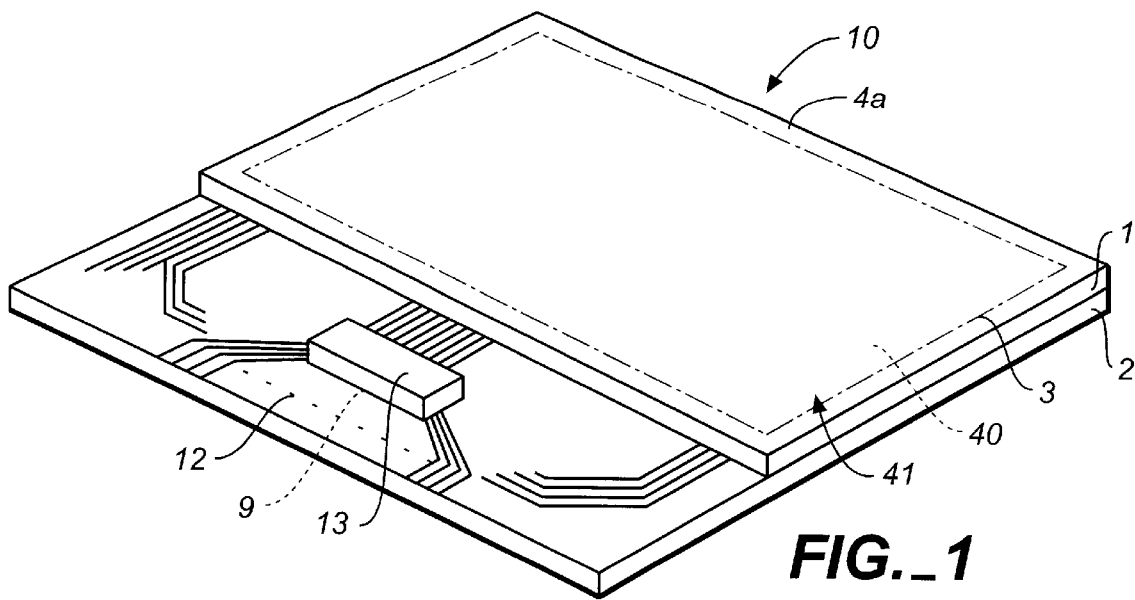
FIG._1
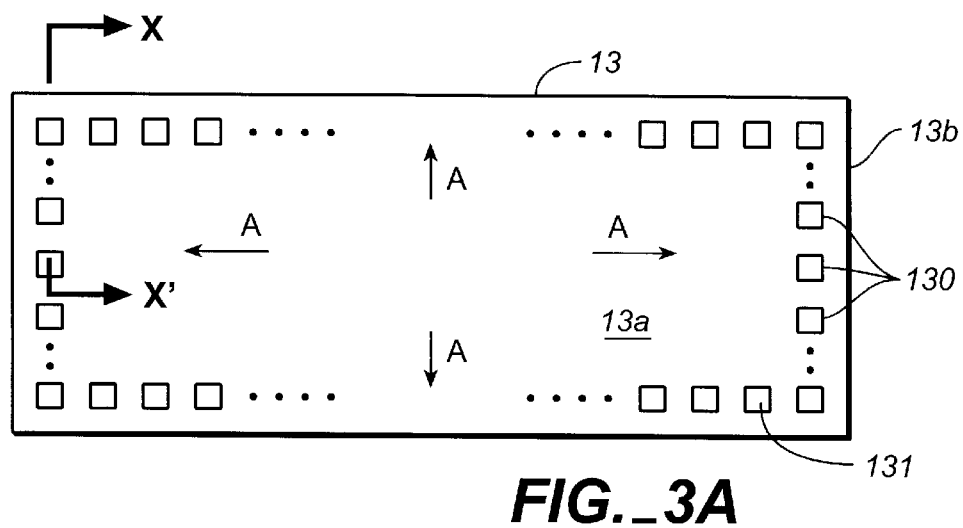
FIG._3A
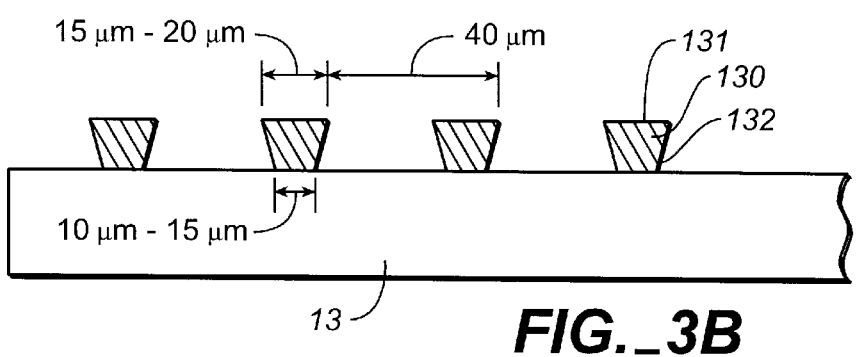
FIG._3B

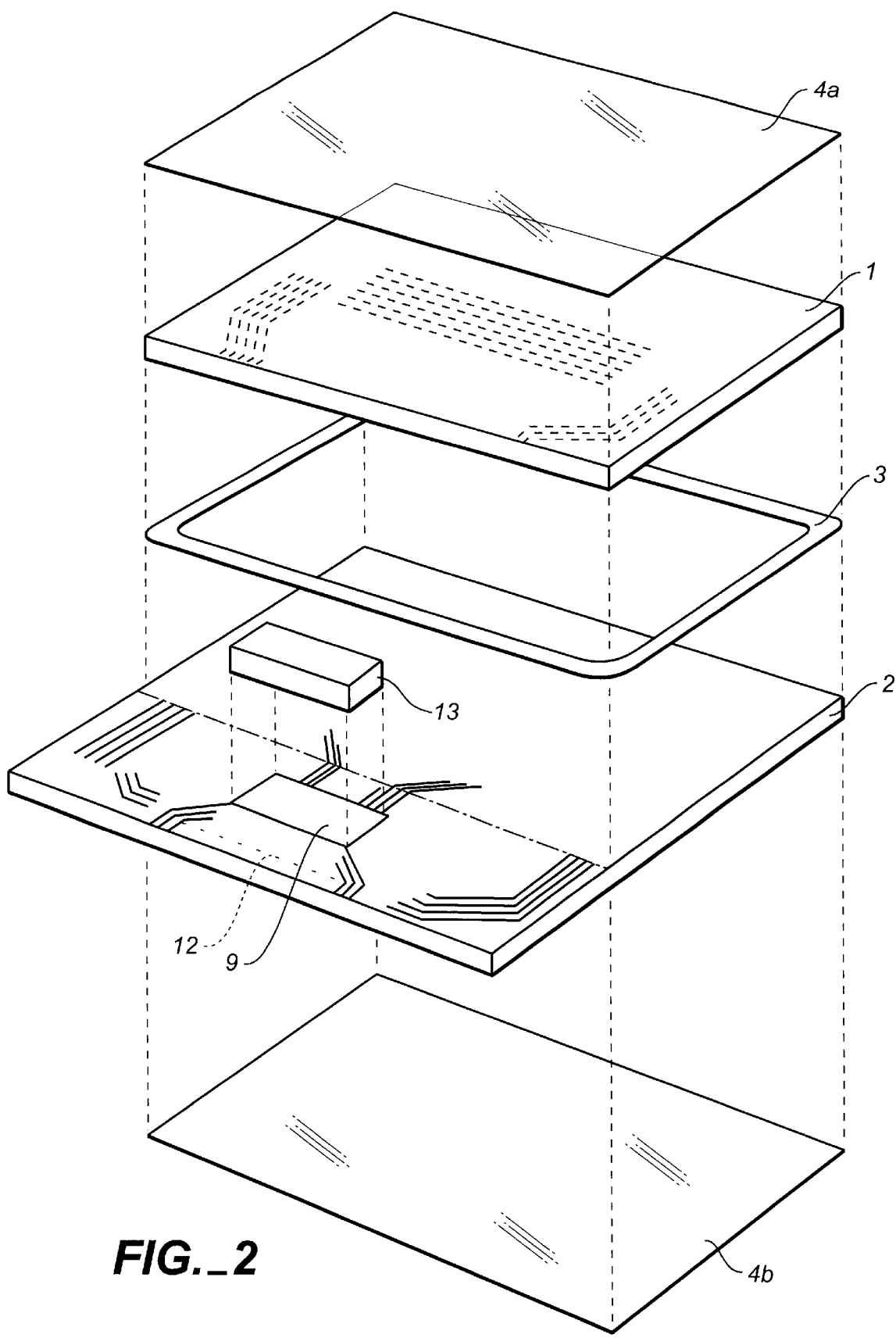
FIG._2

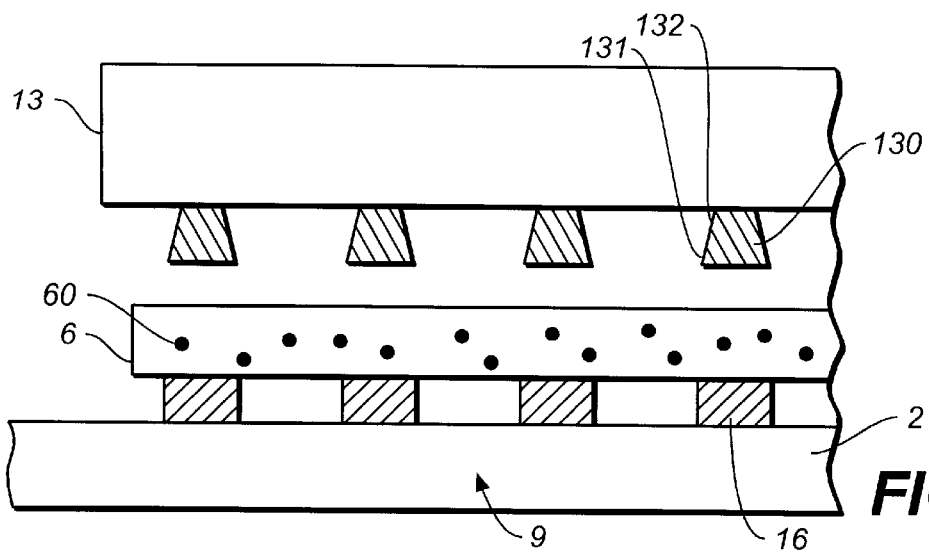
FIG._4A
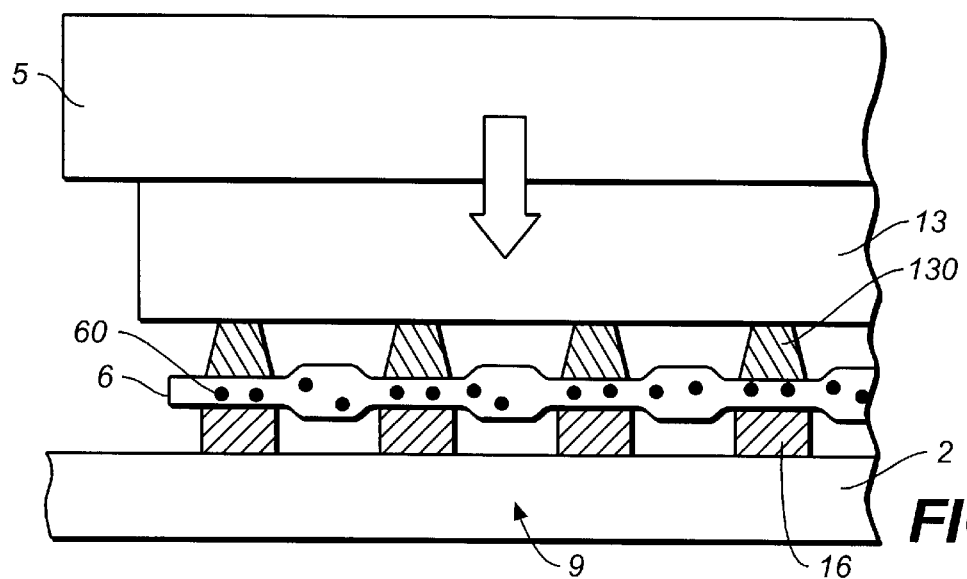
FIG._4B
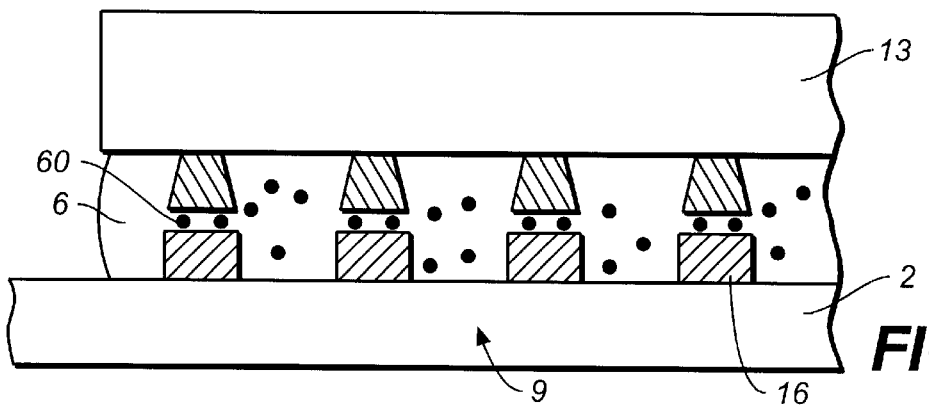
FIG._4C

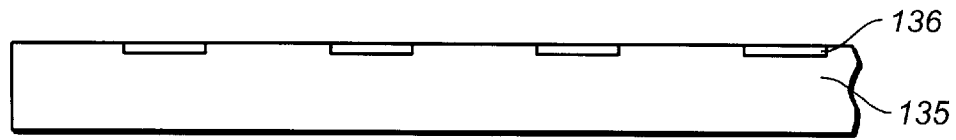
*FIG._5A*
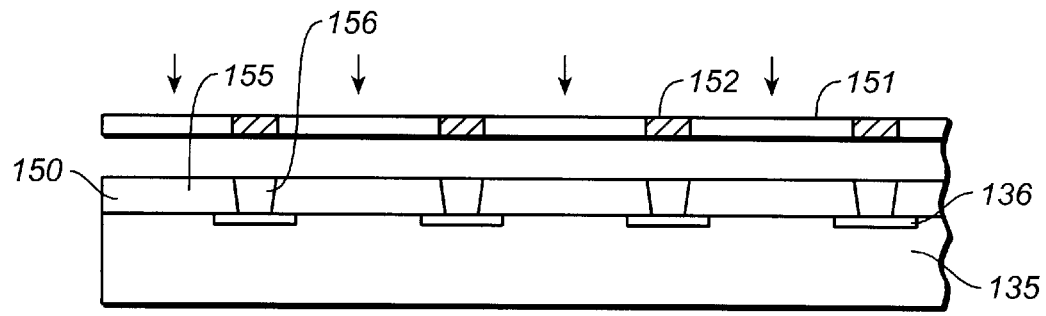
*FIG._5B*
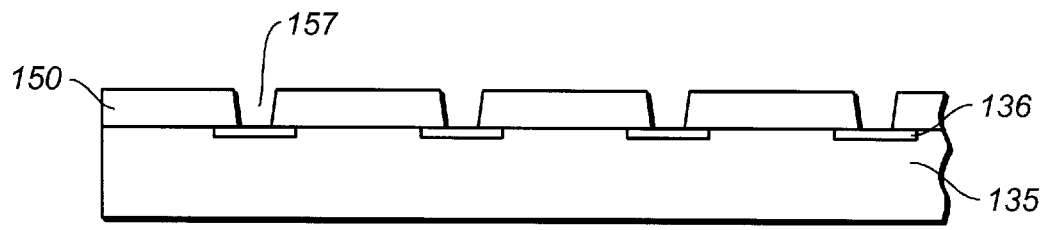
*FIG._5C*
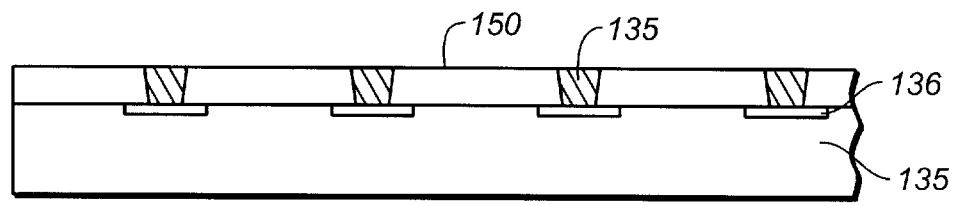
*FIG._5D*
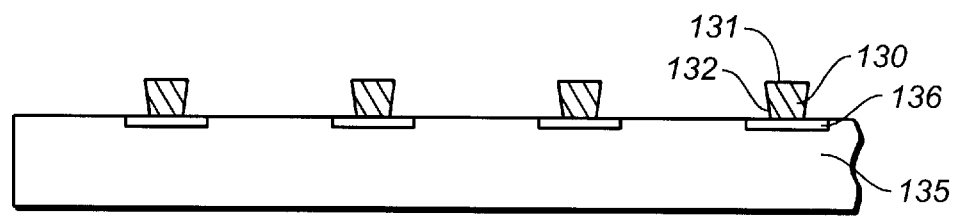
*FIG._5E*

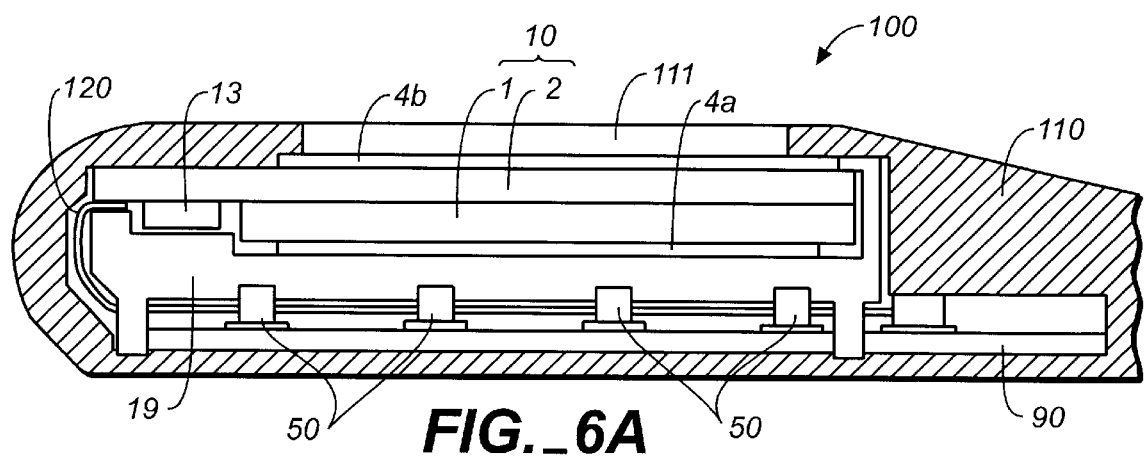
FIG._6A
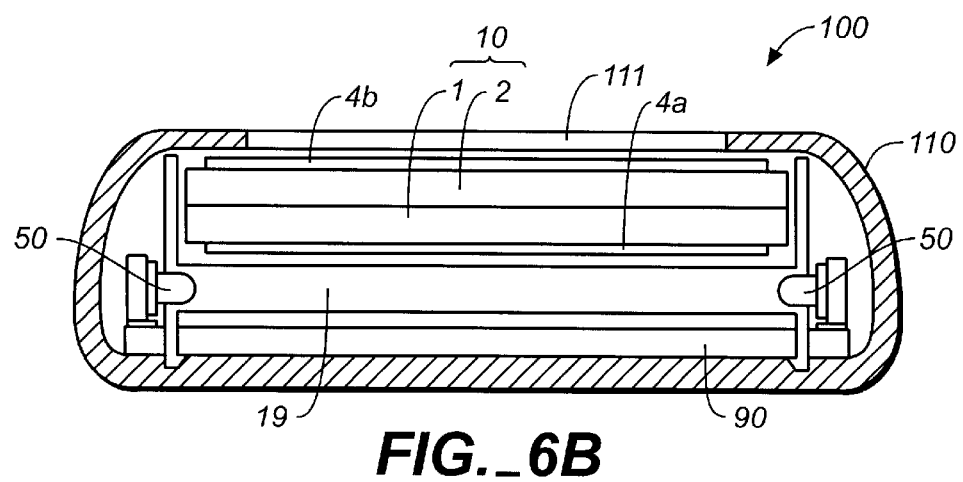
FIG._6B

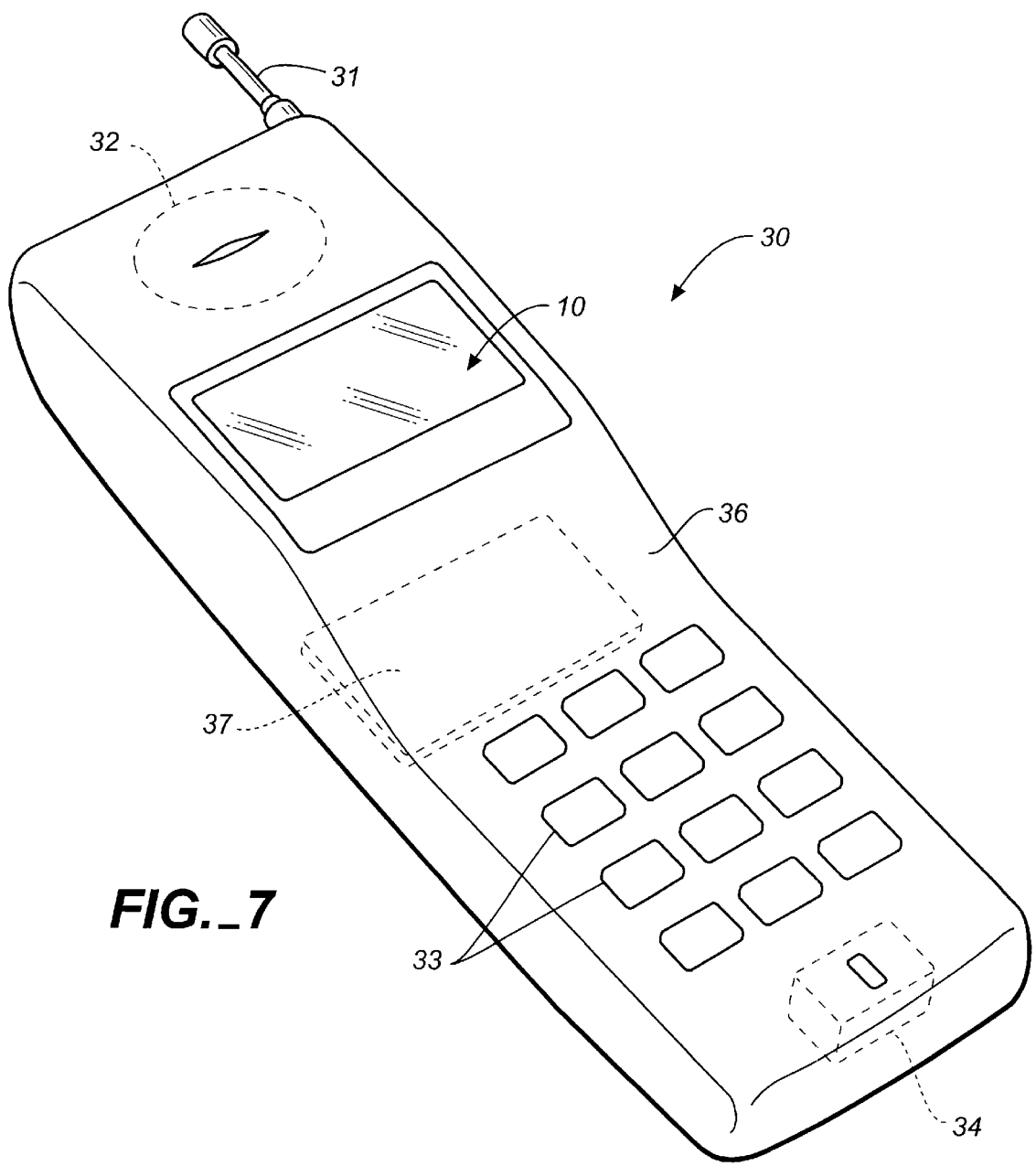
FIG._7

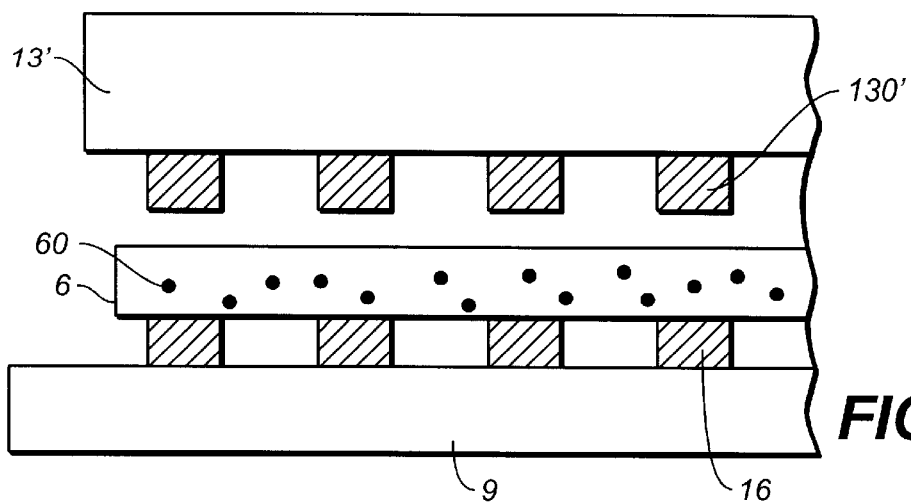
FIG._8A
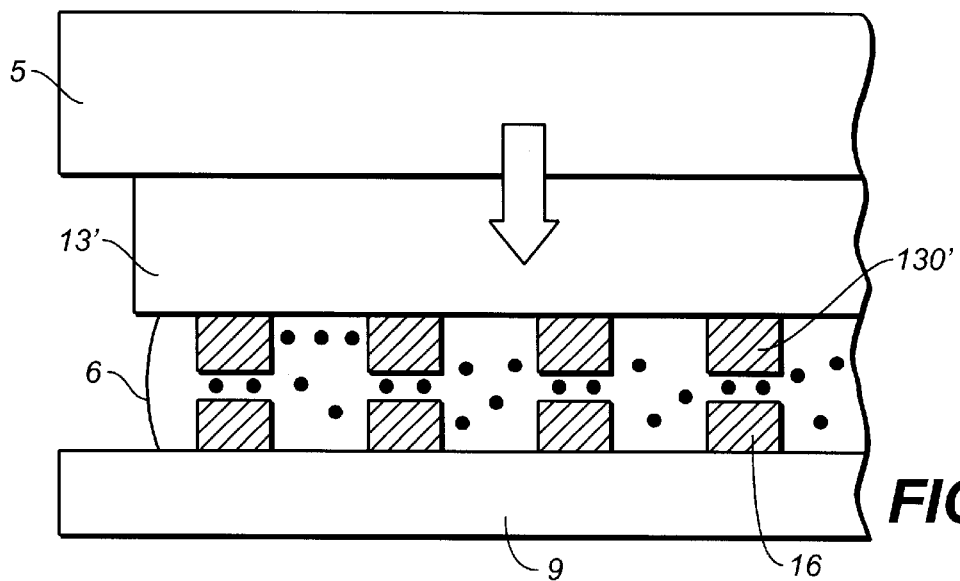
FIG._8B
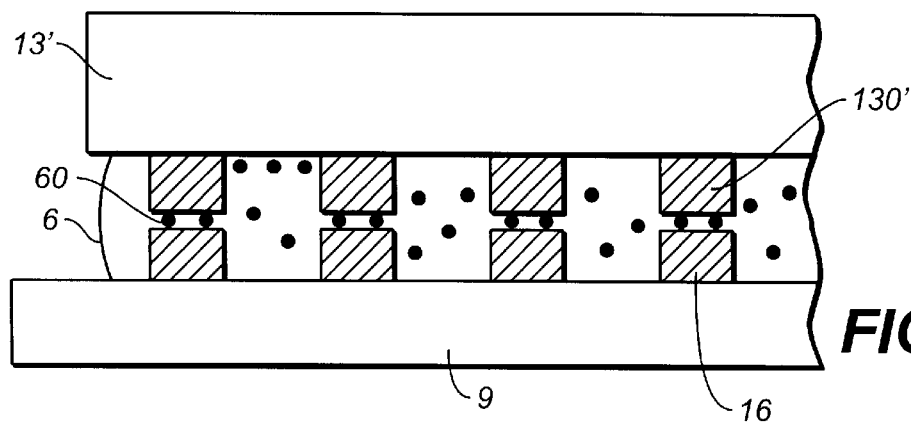
FIG._8C

SEMICONDUCTOR DEVICE, SEMICONDUCTOR DEVICE MOUNTING STRUCTURE, LIQUID CRYSTAL DEVICE, AND ELECTRONIC APPARATUS

BACKGROUND OF THE INVENTION

1. Field of the Invention

The present invention relates to a semiconductor device (hereinafter sometimes referred to as an "IC"), a mounting structure thereof, a liquid crystal device using the mounting structure, and an electronic apparatus using the liquid crystal device.

2. Description of the Related Art

With either the COG (chip on glass) or COF (chip on film) mounting methods, mounting a face-down-bonding type IC using an ACF (anisotropic conductive film) makes it possible to cope with fine pitches and to collectively connect a plurality of contacts electrically, thus making the method suitable for mounting a driving IC on electrode terminals formed on a liquid crystal panel or on a flexible wiring substrate.

As shown in FIG. 8A, when mounting an IC using such an anisotropic conductive film 6, the film is deposited on an IC mounting region 9 of a substrate, such as a glass or flexible wiring substrate. A driving IC 13' is then arranged on the surface of this anisotropic conductive film 6. Next, as shown in FIG. 8B, the driving IC 13' is mounted to the substrate by thermal compression bonding using a bonding head 5. As a result, the resin component of the anisotropic conductive film 6 is melted and fluidized. Thereafter, the anisotropic conductive film 6 is cured, and then the resin component of the anisotropic conductive film 6 is solidified, to mount the driving IC 13' onto the IC mounting region 9. During this step, the bump electrodes 130' of the driving IC 13' are electrically connected to electrode terminals 16 on the substrate side through conductive particles 60 contained in the anisotropic conductive film 6. Here, the number of conductive particles 60 positioned between the bump electrodes 130' and the electrode terminals 16 greatly influences the electrical resistance, reliability, etc.

In this mounting structure, each bump electrode 130' of the driving IC 13' is conventionally formed at a pitch of approximately 100 μm, and the shape of the bump electrodes 130' is straight with a fixed width. The surface of the bump electrodes 130' facing, i.e., opposing, the electrode terminals 16 may be curved.

However, in a liquid crystal device (e.g., a liquid crystal display device), the bump electrodes 130' tend to be arranged in higher density as the number of pixels increases, which causes a problem that makes it difficult, if not impossible, to even use conventional bump electrodes 130' in liquid crystal devices. That is, when the bump electrode density is increased such that the pitch of the bump electrodes 130' is approximately 40 μm, conductive particles 60 will gather in high density between adjacent bump electrodes 130' when the anisotropic conductive film 6 is melted, causing short-circuiting between bump electrodes 130'. On the other hand, when the bump electrodes 130' are made narrower in width, the number of conductive particles 60 between the bump electrodes 130' and the electrode terminals 16 will decrease, impairing the electrical characteristics (e.g., resistivity, etc.) and reliability of the device.

SUMMARY OF THE INVENTION

Objects of the Invention

Therefore, it is an object of the present invention to overcome the aforementioned problems.

It is another object of the invention to provide an IC and a mounting structure thereof with an improved bump electrode structure, whereby the bump electrodes are electrically connected to electrode terminals on a substrate through an anisotropic conductive film without compromising, or causing deterioration of, the electrical characteristics or reliability, even when the bump electrodes are formed with a narrow (e.g., small) pitch.

It is further object of the invention to provide a liquid crystal device employing such an IC or mounting structure thereof It is yet another object of the invention to provide an electronic apparatus employing such an IC or mounting structure thereof.

To achieve the above objects, one aspect of the invention provides a semiconductor device comprising a first substrate, and a plurality of electrodes, each having a base portion formed on the first substrate and an upper portion, and each adapted to be electrically connected to a corresponding electrode terminal on a second substrate through an anisotropic conductive film containing conductive particles. In accordance with the invention, the base portion of each electrode has a cross-sectional width that is substantially less than the cross-sectional width of the upper portion facing the corresponding electrode terminal to the base portion.

When the semiconductor device of the present invention is mounted to a substrate through an anisotropic conductive film to electrically connect the electrode terminals on the second substrate and the bump electrodes on the semiconductor device side, the resin component of the anisotropic conductive film is melted and the conductive particles will flow from the inner areas between the semiconductor device and the substrate toward the outer periphery. Because the base portions of the bump electrodes are made narrower, there are wide gaps between the base portions of adjacent bump electrodes even when such electrodes are formed in high density. Thus, when the anisotropic conductive film is melted and the conductive particles flow from the inner area between the semiconductor device and the substrate toward the outer periphery of semiconductor device, a large number of conductive particles do not gather between adjacent bump electrodes, so that the conductive particles do not cause short-circuiting between the bump electrodes. Further, although the bump electrodes are made narrower at the base portion, the upper portions thereof facing the electrode terminals of the substrate are wider, such that the area of the surface of each bump electrodes which faces a corresponding electrode terminal is large. Thus, a large number of conductive particles exist between the bump electrodes and the electrode terminals, so that a satisfactory electrical connection is effected between the bump electrodes and the electrode terminals. Thus, even if the bump electrodes of the semiconductor device are formed in high density, it is possible to achieve a high level of reliability.

The semiconductor and semiconductor mounting structure of the present invention is applicable to various types of semiconductor devices. In a liquid crystal device, the semiconductor device of the present invention is effectively mounted on either one of the substrates forming a liquid crystal panel or on a wiring substrate electrically connected to the liquid crystal panel. When such a liquid crystal device is used as a display device for an electronic apparatus, such as a mobile telephone, a higher display quality can be achieved without compromising reliablity. By utilizing a semiconductor device of the present invention, which permits a higher density arrangement of bump electrodes without short circuiting the device, the number of display pixels in the liquid crystal device can be increased to increase display quality. Although a large number of conductive particles do not gather between bump electrodes to create short circuiting problems, a large number of such particles are secured between the bump electrodes and the electrode terminals, thereby making it possible to effect satisfactory electrical connection between the bump electrodes and the electrode terminals.

The invention also provides a method of manufacturing a semiconductor device. The method comprises forming a plurality of electrodes on a surface of a semiconductor substrate, applying a photosensitive resist layer to the surface of the semiconductor, exposing the photosensitive resist layer to light through an exposure mask having a plurality of shielding portions, each aligned with a respective one of the plurality of electrodes, creating a plurality of openings in the photosensitive resist layer, each opening being aligned with a corresponding one of the plurality of electrodes and having a reversed-taper shape, filling the plurality of openings with an electrode plating material; and removing the photosensitive resist layer.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, wherein like reference symbols refer to like parts:

FIG. 1 is a perspective view of a liquid crystal device, constructed according to embodiments of the invention;

FIG. 2 is an exploded, perspective view of the liquid crystal device shown in FIG. 1;

FIG. 3A is a plan view showing the surface of a driving IC, including an arrangement of bump electrodes formed thereon, according to embodiments of the invention;

FIG. 3B is a sectional view taken along the line X–X' of FIG. 3A;

FIGS. 4A through 4C are sectional views showing the process for mounting a driving IC of the type shown in FIGS. 3A and 3B onto a second transparent substrate which may constitute a liquid crystal panel;

FIGS. 5A through 5E are sectional views showing the method of forming the bump electrodes of a driving IC of the type shown in FIGS. 3A and 3B;

FIGS. 6A and 6B are sectional views showing the main parts of a mobile telephone (electronic apparatus) having a liquid crystal device constructed according to embodiments of the invention;

FIG. 7 is a perspective view of a mobile telephone (electronic apparatus) having a liquid crystal device constructed according to embodiments of the invention; and FIGS. 8A through 8C are sectional views showing the process for mounting a conventional IC on a substrate.

DESCRIPTION OF THE PREFERRED EMBODIMENTS

Embodiments of the present invention will be described with reference to the accompanying drawings.
General Construction FIG. 1 is a perspective view showing a passive matrix type liquid crystal device, and FIG. 2 is an exploded, perspective view thereof In FIGS. 1 and 2, a liquid crystal device 10 includes a first transparent substrate 1 and a second transparent substrate, each of which can be formed, for example, by a transparent glass. A seal material 3 is formed on one of these substrates by printing or the like, and the first and second transparent substrates 1 and 2 are secured to each other, with the seal material 3 placed therebetween. In the gap (e.g., cell gap) between the first and second transparent substrates 1 and 2, a liquid crystal sealing region 40 defined by the seal material 3 has liquid crystals 41 sealed therein. A polarizing plate 4a is attached to the outer surface of the first transparent substrate 1 by adhesive or the like, and another polarizing plate 4b is attached to the outer surface of the second transparent substrate 2 by adhesive or the like.

Because the second transparent substrate 2 is larger than the first transparent substrate 1, a part of the second transparent substrate 2 protrudes from the lower edge of the first transparent substrate 1 when the first transparent substrate 1 is superimposed on the second transparent substrate 2, as shown in FIG. 2. Formed on this protruding portion is an IC mounting region 9, where a driving IC 13, which is a semiconductor device, is COG-mounted by face down bonding. Such mounting, which will be described in more detail below, is effected by placing an anisotropic conductive film between the second transparent substrate 2 and the driving IC 13 and thermal compression bonding them together. As a result, the bump electrodes of the driving IC 13 are electrically connected to the electrode terminals of the IC mounting region 9 of the second transparent substrate 2 via the anisotropic conductive film.

Also, on the second transparent substrate 2, input terminals 12 are formed below the IC mounting region 9, and a flexible printed circuit board (not shown) is connected to these input terminals 12 by heat sealing or the like.

Further, although not shown in detail in FIGS. 1 and 2, on the inner surface of the first transparent substrate 1, there is formed an electrode pattern (thin film pattern) consisting of a plurality of stripe-shaped electrodes extending horizontally inside the liquid crystal sealing region 40, and a wiring pattern for connecting the stripe-shaped electrodes to each terminal outside the liquid crystal sealing region 40. This electrode pattern is formed of a transparent ITO (indium tin oxide) film or the like. An electrode pattern (thin film pattern) and wiring pattern are also formed on the inner surface of the second transparent substrate 2. In this case, the electrode pattern (thin film pattern) consists of a plurality of stripe-shaped electrodes extending vertically inside the liquid crystal sealing region 40, with the wiring pattern connecting the stripe-shaped electrodes to the IC mounting region 9 or the like outside the liquid crystal sealing region 40. This electrode pattern is also formed of a transparent ITO film or the like.

When the first transparent substrate 1 and the second transparent substrate 2, constructed as described above, are bonded together as shown in FIG. 1 to form a panel (e.g., a liquid crystal panel) while effecting electrical connection at specified positions, the stripe-shaped electrodes of the first transparent substrate 1 and the stripe-shaped electrodes of the second transparent substrate 2 intersect with each other to thereby form pixels. Further, in the gap between the first transparent substrate 1 and the second transparent substrate 2, liquid crystals 41 are sealed in the liquid crystal sealing region 40. Thus, when driving power and a driving signal are supplied to the driving IC 13, the driving IC 13 applies voltage to a desired stripe-shaped electrode in accordance with the driving signal to control the orientation of the liquid crystals 41 for each pixel, so that a desired image is displayed on the liquid crystal device 10.

Mounting Structure for Driving IC 13

FIG. 3A is a plan view showing the surface of the driving IC 13 which is mounted on the second transparent substrate 2, and FIG. 3B is a sectional view taken along the line X–X' in FIG. 3A. FIGS. 4A through 4C are diagrams showing the process by which the driving IC 13 is mounted on the substrate.

In the liquid crystal device 10 shown in FIGS. 1 and 2, a large number of wiring pattern ends are gathered in the IC mounting region 9. These ends, e.g., the forward end portions of the wiring pattern, constitute electrode terminals 16. One way to improve the display quality of the liquid crystal device 10 is to increase the number of pixels. This results in an increase in the number of stripe-shaped electrodes formed in the liquid crystal panel, and further results in a high density arrangement of the electrode terminals 16 (see FIG. 4).

Thus, as shown in FIG. 3A, the plurality of bump electrodes 130 formed on a mounting surface 13a of the driving IC 13 will also be disposed at a higher density, as the number of pixels of the liquid crystal device 10 increases. That is, the bump electrodes 130 are formed with a narrower pitch along the chip sides 13b, for example, with a pitch of approximately 40 $\mu$m. The upper surface of each bump electrode 130 is rectangular in shape and has a width of approximately 15 to 20 $\mu$m, so that upper portions 131 of adjacent bump electrodes 130 are separated from each other by a small gap of approximately 20 $\mu$m to 25 $\mu$m.

Here, as shown in FIG. 3B, the width of the base portions 132 of the bump electrodes 130 of the driving IC 13 are narrower than that of the upper portions 131 that face the electrode terminals 16 of the second transparent substrate 2. More specifically, the width of the base portions 132 is about 10 to 15 $\mu$m. Thus, while the upper portions 131 of adjacent bump electrodes 130 are spaced apart from each other by narrow gaps of 20 $\mu$m to 25 $\mu$m, the base portions 132 thereof are spaced apart from each other by wider gaps of about 25 to 30 $\mu$m.

The IC mounting structure of this embodiment will be described by describing the process of mounting the driving IC 13 constructed as described above.

When mounting the driving IC 13 of this embodiment on the mounting region 9 of the second transparent substrate 2, the anisotropic conductive film 6 is first deposited on the IC mounting region 9 of the second transparent substrate 2, as shown in FIG. 4A. Then the driving IC 13 is arranged on the surface of this anisotropic conductive film 6, with the bump electrodes 130 facing downward for face down bonding. In this anisotropic conductive film 6, conductive particles 60 that are formed in a metallic film on the surface of plastic balls are dispersed in a thermosetting resin. Next, as shown in FIG. 4B, the driving IC 13 is heat-bonded onto the second substrate 2 using a bonding head 5. As a result, the resin component of the anisotropic conductive film 6 is melted.

In the next step, shown in FIG. 4C, the melted anisotropic conductive film 6 is fluidized and cured, and then the resin component of the anisotropic conductive film 6 is solidified, to securely mount the driving IC 13 onto the IC mounting region 9 and to electrically connect the bump electrodes 130 of the driving IC 13 to the electrode terminals 16 on the substrate side through the conductive particles 60 contained in the anisotropic conductive film 6.

When the driving IC 13 is mounted in this way, the resin component of the anisotropic conductive film 6 is melted, and, as indicated by the arrows A in FIG. 3A, the resin component and the conductive particles 60 between the driving IC 13 and the second transparent substrate 2 will flow from an inner area of the driving IC 13 toward an outer periphery thereof through the gaps between the bump electrodes 130. In this embodiment, the base portions 132 of the bump electrodes 130 of the driving IC 13 are tapered and relatively thin, as shown in FIG. 3B and FIGS. 4A through 4C, so that even if the bump electrodes 130 are formed in high density, the base portions 132 of the adjacent bump electrodes 130 are spaced apart from each other by wider gaps than the corresponding upper portions 131. These wider gaps at the base portions 132 act as channels through which the resin component and the conductive particles 60 of the anisotropic conductive film 6 pass to prevent large numbers of conductive particles 60 from collecting between adjacent bump electrodes 130 and short-circuiting the bump electrodes 130. While the narrower base portions 132 of bump electrodes prevent or at least minimize short-circuiting, the wider upper portions 131 improve the electrical connection between the bump electrodes and corresponding electrode terminals 16. The wider upper portion 132 of each bump electrode provides more surface area facing the electrode terminals 16 whose corresponding facing surfaces have like-sized surface areas. As a result, a large number of conductive particles 60 collect between the facing surfaces of the bump electrodes 130 and the electrode terminals 16, so that the bump electrodes 130 and the electrode terminals 16 are electrically connected to each other in a satisfactory manner. Thus, with this arrangement, it is possible to achieve a high level of reliability, even if the bump electrodes 130 of the driving IC 13 are formed in high density.

Method of Producing Bump Electrodes 130 of Driving IC 13

Regarding the method of producing the driving IC 13 used in this mounting structure, the process for forming the bump electrodes 130 will be described with reference to FIGS. 6A through 5E, which are sectional views showing the process for forming bump electrodes 130.

First, as shown in FIG. 5A, electrodes 136 are formed on the surface of a semiconductor substrate 135 forming the driving IC 13. Then, as shown in FIG. 5B, a photosensitive resist 150 is applied. This photosensitive resist 150 is a negative type. Thus, when the photosensitive resist 150 is exposed to light through an exposure mask 151, only the regions of the photosensitive resist 150 which are covered with shielding portions 152 of the exposure mask 151 are removed in the etching (development) process, as shown in FIG. 5C.

When forming the resist 150 in such a specified or predetermined pattern, the light applied is also diffused in the horizontal direction in the exposure process shown in FIG. 5B, so that the boundary between the non-exposed portion 155 and the exposed portion 156 exhibits a reverse-tapered shape. Thus, as shown in FIG. 5C, the side wall of the opening portions 157 of the resist 150 exhibits a reverse-tapered shape.

After thus forming the resist 150 in a specified or predetermined pattern, the surface of the electrodes 136 is plated. As a result, as shown in FIG. 5D, plating 135 is effected on the surface side of the electrodes 136 in such a way as to fill the opening portions 157 of the resist 150.

Thus, when the resist 150 is removed after the plating, bump electrodes 130 are formed with the base portions 132 narrower than the upper portions 131 thereof, as shown in FIG. 5E.

Example of Mounting in Electronic Apparatus

FIG. 7 shows a mobile telephone 30 which is an example of one type of electronic apparatus which may embody a liquid crystal device constructed in accordance with the present invention. The liquid crystal device of the present invention is also applicable to other electronic apparatuses, such as mobile information terminals, electronic organizers, or video camera finders.

The mobile telephone 30 comprises various components such as an antenna 31, a speaker 32, a liquid crystal device 10, a key pad 33 and a microphone 34, accommodated in an outer case 36 that serves as the housing. Also provided in the case 36 is a control circuit board 37 on which a control circuit to control the operation of the above components is mounted. The liquid crystal device 10 is of the type shown in FIG. 1.

In this mobile telephone 30, signals input through the key pad 33 and the microphone 34, reception data received by the antenna 31, etc. are input to the control circuit on the control circuit board 37. The control circuit displays images such as numbers, characters, patterns, etc. in accordance with various items of input data, and further receives reception data from the antenna 31.

FIGS. 6A and 6B are sectional views showing the main parts of a mobile telephone 100 (electronic apparatus) in which the liquid crystal device 10 is mounted in accordance with this embodiment of the invention.

In mobile telephone 100, shown in FIGS. 6A and 6B, a transparent light guide plate 19 of acrylic resin or polycarbonate is superimposed on the first transparent substrate 1 side of the liquid crystal device 10, and a flexible wiring substrate 120 is drawn out from between a light guide plate 19 and the second transparent substrate 2 and is electrically and mechanically connected to a printed circuit board 90 which forms the circuit board of the mobile telephone 100 main body. Adjacent to a side (or end portion) of the light guide plate 19, there is arranged a backlight light emitting device 50 for emitting light toward the end portion (light incident portion) of the light guide plate 19. An LED or the like is used as this backlight light emitting device 50, and is mounted on the printed circuit board 90. While in this embodiment the backlight device 50 is mounted on the printed circuit board 90, device 50 can also be mounted on the flexible wiring substrate 120 at any position which allows incident light to fall on the light guide plate 19. Further, it is also possible to mount device 50 on a sub-substrate which is separate from the printed circuit board 90. Here, the liquid crystal device 10 is fastened to the light guide plate 19 by a double-sided tape or the like and restrained by frame 110. Further, the light guide plate 19 secures the liquid crystal device 10 and integrally holds the printed circuit board 90 by, for example, engaging with it. The light guide plate 19 is also fastened to the frame 110 of the mobile telephone 100. A glass cover 111 is placed on the second transparent substrate 2 side.

Other Embodiments

While in the above-described embodiments the driving IC 13 is COG-mounted on the second transparent substrate 2 which may constitute the liquid crystal panel, the driving IC 13 may also be COF-mounted on the flexible wiring substrate which is electrically connected to the liquid crystal panel. Even in the latter case, the driving IC 13 may be mounted on the flexible wiring substrate through the anisotropic conductive film 6 instead of the second transparent substrate 2, in the mounting process described with reference to FIGS. 4A through 4C.

Advantages

As described above, in the present invention, the bump electrodes of the IC are tapered toward the base portions, so that, even when the bump electrodes are formed in high density, the base portions of the adjacent bump electrodes are spaced apart from each other by wide gaps. Thus, when the anisotropic conductive film is melted and fluidized, during the mounting of the IC to the substrate via the anisotropic conductive film, a large number of conductive particles do not gather between adjacent bump electrodes. Instead, most of the conductive particles that would otherwise gather between adjacent bump electrodes flow out through the wider gaps between the bump electrode bases and collect at the periphery of the IC substrate. As a result, the conductive particles do not cause short-circuiting between the bump electrodes. Furthermore, since the upper portions of the bump electrodes are wider and the opposing surface areas of both the bump electrodes and the electrode terminals are relatively large, a higher density and hence a relatively large number of conductive particles become positioned between the bump electrodes and the electrode terminals. This ensures that the bump electrodes and the electrode terminals are electrically connected in a satisfactory manner. Therefore, it is possible to achieve a high level of reliability even when the bump electrodes of the IC are formed in high density.

While the invention has been described in conjunction with several specific embodiments, many further alternatives, modifications, variations and applications will be apparent to those skilled in the art in light of the foregoing description. Thus, the invention described herein is intended to embrace all such alternatives, modifications, variations and applications as may fall within the spirit and scope of the appended claims.

What is claimed is:

1. A semiconductor device, comprising:
   a first substrate having a first edge and a second edge substantially perpendicular to the first edge;
   a second substrate to which the first substrate is mounted;
   a resin for bonding the first substrate and the second substrate together;
   a plurality of conductive particles in the resin;
   a plurality of first electrodes aligned with the first edge, each of the first electrodes having a base surface formed on the first substrate, an upper surface, and a pair of opposing side walls aligned with the second edge, wherein, for each of the first electrodes, the cross-sectional width between the pair of opposing side walls linearly decreases from the upper surface towards the base surface; and
   a plurality of second electrodes aligned with the second edge, each of the second electrodes having a base surface formed on the first substrate, an upper surface, and a pair of opposing side walls aligned with the first edge, wherein, for each of the second electrodes, the cross-sectional width between the pair of opposing side walls linearly decreases from the upper surface towards the base surface;
   wherein the resin is able to flow outwardly through gaps between adjacent first electrodes and gaps between adjacent second electrodes when the first substrate and the second substrate are bonded together.

2. The semiconductor device of claim 1, wherein the upper surface of each electrode has a width of between about 15 $\mu$m and about 20 $\mu$m.

3. The semiconductor device of claim 1, wherein the upper portions of adjacent first electrodes and the upper portions of adjacent second electrodes are separated from each other by a gap of between about 20 $\mu$m and about 25 $\mu$m.

4. A liquid crystal device comprising a semiconductor device according to claim 1.

5. A semiconductor device mounting structure, comprising:
- a semiconductor device comprising
  - a first substrate having a first edge and a second edge substantially perpendicular to the first edge and also including a plurality of first electrodes and a plurality of second electrodes;
  - a second substrate including a plurality of electrode terminals;
  - a resin for bonding the first substrate and the second substrate together, wherein each of first and second electrodes is electrically connected to a corresponding one of the electrode terminals; and
  - a plurality of conductive particles in the resin;
  - wherein the plurality of first electrodes are aligned with the first edge, each of the first electrodes having a base surface formed on the first substrate, an upper surface, and a pair of opposing side walls aligned with the second edge, wherein, for each of the first electrodes, the cross-sectional width between the pair of opposing side walls linearly decreases from the upper surface towards the base surface;
  - wherein the plurality of second electrodes are aligned with the second edge, each of the second electrodes having a base surface formed on the first substrate, an upper surface, and a pair of opposing side walls aligned with the first edge, wherein, for each of the second electrodes, the cross-sectional width between the pair of opposing side walls linearly decreases from the upper surface towards the base surface; and
  - wherein the resin is able to flow outwardly through gaps between adjacent first electrodes and gaps between adjacent second electrodes when the first substrate and the second substrate are bonded together.

6. The semiconductor device mounting structure of claim 5, wherein the upper surface of each electrode faces a surface of the corresponding electrode terminal, each upper surface having a width of between about 15 $\mu$m and about 20 $\mu$m.

7. The semiconductor device mounting structure of claim 5, wherein the upper portions of adjacent first electrodes and the upper portions of adjacent second electrodes are separated from each other by a gap of between about 20 $\mu$m and about 25 $\mu$m.

8. A semiconductor device, comprising:
- an IC having a first edge and a second edge substantially perpendicular to the first edge;
- a substrate to which the IC is mounted;
- a resin for bonding the IC and the substrate together;
- a plurality of conductive particles in the resin;
- a plurality of first electrodes aligned with the first edge, each of the first electrodes having a base surface formed on the IC, an upper surface, and a pair of opposing side walls aligned with the second edge, wherein, for each of the first electrodes, the cross-sectional width between the pair of opposing side walls linearly decreases from the upper surface towards the base surface; and
- a plurality of second electrodes aligned with the second edge, each of the second electrodes having a base surface formed on the IC, an upper surface, and a pair of opposing side walls aligned with the first edge, wherein, for each of the second electrodes, the cross-sectional width between the pair of opposing side walls linearly decreases from the upper surface towards the base surface;
- wherein the resin is able to flow outwardly through gaps between adjacent first electrodes and gaps between adjacent second electrodes when the IC and the substrate are bonded together.

9. A semiconductor device of claim 8, wherein the first and the second edges intersect to form a corner.

10. A liquid crystal device comprising a semiconductor device according to claim 8.

11. A semiconductor device, comprising:
- a substrate;
- an IC including a first edge and a second edge substantially perpendicular to the first edge, the IC being mounted on the substrate by heat-compressing;
- a resin for joining the IC and the substrate;
- a plurality of conductive particles in the resin;
- a plurality of bumps aligned with the first edge, each of the bumps having a base surface formed on the IC, an upper surface, a pair of opposing side walls aligned with the second edge, wherein, for each of the bumps, the cross-sectional width between the pair of opposing side walls linearly decreases from the upper surface towards the base surface;
- wherein the resin flows through gaps between adjacent bumps in the process of the heat-compressing.

12. A semiconductor device, comprising:
- an IC including at least one edge;
- a substrate to which the IC is mounted by heat-compressing;
- a resin for joining the IC and the substrate;
- a plurality of conductive particles in the resin;
- a plurality of bumps aligned with the at least one edge, each of the bumps having an upper surface and a pair of opposing side walls; and
- a plurality of spaces formed between each of two adjacent bumps, each space between two adjacent bumps linearly increasing in width from top to bottom;
- wherein the resin flows through the spaces between adjacent electrodes during the process of heat-compressing.

13. A semiconductor device comprising a substrate, an IC having a first edge and a second edge substantially perpendicular to the first edge, a resin for joining the IC and the substrate, a plurality of conductive particles in the resin, a plurality of bumps aligned with the first edge, each of the bumps having a base surface formed on the IC, an upper surface, a pair of opposing side walls aligned with the second edge, wherein, for each of the bumps, the cross-sectional width between the pair of opposing side walls linearly decreases from the upper surface towards the base surface, the semiconductor device manufactured by a process comprising the steps of:
- depositing the resin on the substrate;
- arranging the IC on the substrate; and
- pressing the substrate and IC together;
- wherein the resin flows through gaps between adjacent bumps during the pressing step.

* * * * *